US010942220B2

(12) United States Patent
van der Wagt et al.

(10) Patent No.: US 10,942,220 B2
(45) Date of Patent: Mar. 9, 2021

(54) VOLTAGE DRIVER WITH SUPPLY CURRENT STABILIZATION

(71) Applicant: Teradyne, Inc., North Reading, MA (US)

(72) Inventors: Jan Paul Anthonie van der Wagt, Carlsbad, CA (US); Greg Warwar, Moorpark, CA (US)

(73) Assignee: Teradyne, Inc., North Reading, MA (US)

( * ) Notice: Subject to any disclaimer, the term of this patent is extended or adjusted under 35 U.S.C. 154(b) by 12 days.

(21) Appl. No.: 16/395,104

(22) Filed: Apr. 25, 2019

(65) Prior Publication Data

US 2020/0341060 A1 Oct. 29, 2020

(51) Int. Cl.
*G01R 31/00* (2006.01)
*G01R 31/319* (2006.01)
(Continued)

(52) U.S. Cl.
CPC . *G01R 31/31924* (2013.01); *G01R 31/31905* (2013.01); *G01R 31/318307* (2013.01); *G05F 1/563* (2013.01)

(58) Field of Classification Search
CPC .............. G01R 31/31924; G01R 31/26; G01R 31/2642; G01R 31/2648; G01R 31/2831; G01R 31/31702
See application file for complete search history.

(56) References Cited

U.S. PATENT DOCUMENTS

| 4,777,452 A | 10/1988 | Hayami et al. |
| 5,155,451 A | 10/1992 | Gladden et al. |

(Continued)

FOREIGN PATENT DOCUMENTS

| JP | 5715525 B2 | 5/2015 |
| KR | 10-0601309 B1 | 7/2006 |

(Continued)

OTHER PUBLICATIONS

U.S. Appl. No. 16/395,082, filed Apr. 25, 2019, van der Wagt et al.
(Continued)

*Primary Examiner* — Tung X Nguyen
(74) *Attorney, Agent, or Firm* — Wolf, Greenfield & Sacks, P.C.

(57) ABSTRACT

Disclosed herein are voltage driver circuits and methods of operating the same to provide a variable output voltage that is suitable for use in ATE to provide a large number of test signals with accurate voltage levels at high data rates using components that consume relatively low power. According to an aspect, a change in output current in a voltage driver related to changing output voltage may be offset by a stabilization current generated by a correction driver for the voltage driver, such that supply currents drawn from the supply voltages can remain substantially stable. The correction driver may be connected to one or more supply voltages, and programmed to output a stabilization current that offsets changes in supply currents arising from changing of the programmed output of the voltage driver circuit. Such a driver may enable a test system to more precisely test semiconductor devices.

18 Claims, 7 Drawing Sheets

(51) Int. Cl.
  *G05F 1/563* (2006.01)
  *G01R 31/3183* (2006.01)

(56) References Cited

U.S. PATENT DOCUMENTS

| | | | |
|---|---|---|---|
| 5,430,337 | A | 7/1995 | Castello et al. |
| 5,436,581 | A | 7/1995 | Oberhauser |
| 5,977,818 | A | 11/1999 | Czarnul et al. |
| 6,166,569 | A | 12/2000 | McQuilkin |
| 6,246,269 | B1 | 6/2001 | Schuler et al. |
| 6,252,441 | B1 | 6/2001 | Lee et al. |
| 6,526,113 | B1 | 2/2003 | Gutierrez et al. |
| 6,859,075 | B1 | 2/2005 | van der Wagt et al. |
| 7,187,742 | B1 | 3/2007 | Logue et al. |
| 7,671,630 | B2 | 3/2010 | Howe et al. |
| 8,446,169 | B1 | 5/2013 | Marlett et al. |
| 8,446,173 | B1 | 5/2013 | Faucher et al. |
| 8,760,188 | B2 | 6/2014 | Gondi et al. |
| 8,779,819 | B1 | 7/2014 | Venditti |
| 8,854,108 | B1 | 10/2014 | Suzuki |
| 9,147,620 | B2 | 9/2015 | van der Wagt et al. |
| 9,231,631 | B1 | 1/2016 | Ke et al. |
| 9,281,969 | B2 | 3/2016 | Gondi et al. |
| 9,397,670 | B2 | 7/2016 | van der Wagt et al. |
| 9,503,065 | B1 | 11/2016 | van der Wagt et al. |
| 9,805,822 | B1 | 10/2017 | Aleksandrowicz |
| 9,887,710 | B1 | 2/2018 | Lim et al. |
| 10,048,717 | B1 | 8/2018 | Chen |
| 10,554,450 | B2 | 2/2020 | Elzeftawi et al. |
| 10,761,130 | B1 | 9/2020 | van der Wagt et al. |
| 2004/0095701 | A1 | 5/2004 | Ingino, Jr. |
| 2004/0263204 | A1 | 12/2004 | Chandler et al. |
| 2005/0193356 | A1 | 9/2005 | Kuekes et al. |
| 2006/0010360 | A1* | 1/2006 | Kojima ............ G01R 31/31932 714/738 |
| 2006/0238175 | A1 | 10/2006 | Cho et al. |
| 2006/0256908 | A1 | 11/2006 | Ludwig |
| 2006/0273832 | A1* | 12/2006 | Matsumoto ...... G01R 31/31713 327/108 |
| 2007/0126410 | A1 | 6/2007 | Figoli |
| 2008/0284466 | A1 | 11/2008 | Cranford, Jr. et al. |
| 2010/0299644 | A1 | 11/2010 | Kawai |
| 2011/0309865 | A1 | 12/2011 | Cordos |
| 2012/0086423 | A1 | 4/2012 | Dao et al. |
| 2012/0158348 | A1 | 6/2012 | Watanabe et al. |
| 2013/0027010 | A1 | 1/2013 | Groeneweg et al. |
| 2014/0035549 | A1 | 2/2014 | Hafizi et al. |
| 2014/0312865 | A1 | 10/2014 | Dobkin et al. |
| 2016/0065183 | A1 | 3/2016 | Antonie van der Wagt |
| 2016/0112223 | A1 | 4/2016 | Kitsukawa et al. |
| 2016/0173090 | A1 | 6/2016 | Meinerzhagen et al. |
| 2016/0227004 | A1 | 8/2016 | Conner |
| 2017/0155317 | A1 | 6/2017 | Wang |
| 2018/0329440 | A1 | 11/2018 | Jefremow et al. |
| 2019/0074838 | A1 | 3/2019 | Kitagawa |

FOREIGN PATENT DOCUMENTS

| | | |
|---|---|---|
| KR | 10-0605498 B1 | 7/2006 |
| KR | 10-0618828 B1 | 8/2006 |
| KR | 10-0798835 B1 | 1/2008 |

OTHER PUBLICATIONS

U.S. Appl. No. 16/395,098, filed Apr. 25, 2019, van der Wagt et al.
U.S. Appl. No. 16/395,120, filed Apr. 25, 2019, van der Wagt et al.
[No Author Listed], LVDS Owner's Manual. Texas Instruments. 4th Edition. 2008. 111 pages. http://www.ti.com/interface/lvds-m-lvds-pecl/technical-documents.html [last accessed: Jul. 17, 2019].
Branson, Integrated Tester Pin Electronics. IEEE Design & Test of Computers. 1990;7:4-14.
Cherry et al., The design of wide-band transistor feedback amplifiers. Proceedings of the Institution of Electrical Engineers. 1963;110(2):375-389. DOI: 10.1049/piee.1963.0050.
Dettloff et al., A 32mW 7.4Gb/s Protocol-Agile Source-Series-Terminated Transmitter in 45nm CMOS SOI. IEEE International Solid-State Circuits Conference Digest of Technical Papers. Feb. 10, 2010. p. 370-371. DOI: 10.1109/ISSCC.2010.5433825.
Enz et al., Charge-Based MOS Transistor Modeling. John Wiley & Sons. 2006. Section 4.4.4. p. 41-42. ISBN: 047085541X.
Ershov et al., EDA software for verification of metal interconnects in ESD protection networks at chip, block, and cell level. 35th Electrical Overstress/Electrostatic Discharge Symposium. Sep. 2013. p. 1-7.
Esch et al., Near-Linear CMOS I/O Driver With Less Sensitivity to Process, Voltage, and Temperature Variations. IEEE Transactions on VLSI Systems. 2004;12(11):1253-7. DOI:10.1109/TVLSI.2004.836321.
Greshishchev et al., A 60-dB Gain, 55-dB Dynamic Range, 10-Gb/s Broad-Band SiGe HBT Limiting Amplifier. IEEE Journal of Solid-State Circuits. 1999;34(12):1914-20. DOI: 10.1109/4.808916.
Hatamkhani et al., A 10mW 3.6Gbps I/O Transmitter. Symposium on VLSI Circuits. Jun. 2003. p. 97-98. DOI: 10.1109/VLSIC.2003.1221172.
Knight et al., A Self-Terminating Low-Voltage Swing CMOS Output Driver. IEEE Journal of Solid-State Circuits. 1988;23(2):457-64. DOI: 10.1109/4.1007.
Kojima et al., 8Gbps CMOS Pin Electronics Hardware Macro with Simultaneous Bi-directional Capability. IEEE International Test Conference. Nov. 2012. p. 1-9. DOI: 10.1109/TEST.2012.6401543.
Kossel et al., A T-Coil-Enhanced 8.5 Gb/s High-Swing SST Transmitter in 65 nm Bulk CMOS With < -16 dB Return Loss Over 10 GHz Bandwidth. IEEE Journal Solid-State Circuits. 2008;43(12):2905-2920. DOI: 10.1109/JSSC.2008.2006230.
Laskin, On-Chip Self-Test Circuit Blocks for High-Speed Applications. Thesis submitted for MS of Applied Science Graduate Department of Electrical and Computer Engineering. University of Toronto. 2006. Chapter 2.3. p. 13-16.
Nauta et al., Analog Line Driver with Adaptive Impedance Matching. IEEE Journal of Solid-State Circuits. 1998;33(12):1992-8. DOI: 10.1109/4.735540.
O'Reilly, Series-Parallel Generation of m-Sequences. Radio and Electronic Engineer. 1975;45(4):171-6. DOI: 10.1049/ree.1975.0033.
Sayag et al., Compact Modeling and Comparative Analysis of Silicon-Chip Slow-Wave Transmission lines With Slotted Bottom Metal Ground planes. IEEE Transaction on Microwave Theory and Techniques. 2009;57(4):840-7. DOI: 10.1109/TMTT.2009.2015041.
Schneider et al., CMOS Analog Design Using All-Region MOSFET Modeling. Cambridge University Press. 2010. Section 1.2.3. p. 7-14. ISBN: 052111036X.
Tanzawa et al., High-Voltage Transistor Scaling Circuit Techniques for High-Density Negative-Gate Channel-Erasing NOR Flash Memories. IEEE Journal of Solid-State Circuits. 2002;37(10):1318-25. DOI: 10.1109/JSSC.2002.803045.
Tsividis, Operation and Modeling of the MOS Transistor. Oxford University Press. 2nd Edition. 1999. Section 4.5.2. p. 156-158. ISBN: 0195170146.
Van Der Wagt et al., 50Gb/s 3.3V Logic ICs in InP-HBT Technology. Symposium on VLSI Circuits Digest of Technical Papers. Jun. 2004. p. 326-329. DOI: 10.1109/VLSIC.2004.1346604.
Wallinga et al., Design and Analysis of CMOS Analog Signal Processing Circuits by Means of a Graphical MOST Model. IEEE J. Solid-St. Circuits. 1989;24(3):672-80. DOI: 10.1109/4.32024.
Zheng et al., Capacitive Floating Level Shifter: Modeling and Design. IEEE Region 10 Conference. Nov. 2015. 6 pages. DOI: 10.1109/TENCON.2015.7373013.
International Search Report and Writen Opinion for International Application No. PCT/US2020/029484, dated Aug. 11, 2020.
International Search Report and Writen Opinion for International Application No. PCT/US2020/029490, dated Aug. 11, 2020.
International Search Report and Writen Opinion for International Application No. PCT/US2020/029499, dated Aug. 5, 2020.
Van Der Wagt et al., Parallel Path Delay Line, U.S. Appl. No. 16/395,082, filed Apr. 25, 2019.

(56) References Cited

OTHER PUBLICATIONS

Van Der Wagt et al., Voltage Driver Circuit, U.S. Appl. No. 16/395,098, filed Apr. 25, 2019.
Van Der Wagt et al., Voltage Driver Circuit Calibration, U.S. Appl. No. 16/395,120, filed Apr. 25, 2019.

* cited by examiner

VOLTAGE DRIVER WITH SUPPLY CURRENT STABILIZATION

BACKGROUND

Electronic components, such as semiconductor devices, circuits, and printed circuit board (PCB) assemblies, are frequently tested, during and after their manufacture, using a test system such as an automated test equipment (ATE). To perform these tests, an ATE may include instruments that generate or measure test signals such that a range of operating conditions can be tested on a particular device-under-test (DUT). An instrument, for example, may generate a pattern of digital or analog signals that are applied to a semiconductor device, and may measure digital or analog signals from the semiconductor device as a response.

An ATE is frequently used to apply a test signal with a specific voltage waveform to one or more test points of the DUT. To generate such a test signal, the ATE may comprise a voltage driver that generates programmable voltage levels. Voltage levels at the output of a voltage driver may be programmed by a digital input, either specified at a user input or from digital signals received from the rest of the ATE.

A voltage driver may be single-ended and provide a programmable output voltage at a single output port for connection to a test point on the DUT. A voltage driver may alternatively be differential and generate a differential voltage signal to drive DUTs that take differential signals as input. The generated differential voltage signal comprises two voltage waveforms that are usually of opposite phase at a pair of differential outputs.

Some voltage drivers generate an output voltage by drawing power from one or more supply voltages. The supply voltages may sometimes be provided as supply voltage rails, which are connected to voltage supplies and define the maximum or minimum voltage level that the voltage driver is capable of outputting. For example, a voltage driver may be connected to a single voltage supply, relative to a reference voltage or ground. A voltage driver may alternatively be connected to two or more distinct supply voltages, such as would be available from a positive and a negative supply.

In operation, the voltage levels of the supply voltages within an ATE are generally not changed, even though the voltage levels at the output of the voltage driver are controllable. Rather, the voltage driver may be controlled to modify the proportion of one of the supplies coupled to the output of the voltage driver such that the voltage level at the output may be set to supply test signals with programmable characteristics so that an ATE may test many types of semiconductor devices.

SUMMARY

Aspects of the present application are directed to voltage driver circuits and methods of operating the same to provide a variable output voltage while drawing stabilized supply current. The inventors have recognized and appreciated that a change in output current related to changing output voltage may be offset by a stabilization current generated by a correction driver for the voltage driver, such that supply currents drawn from the supply voltages can remain substantially stable. The correction driver may be connected to one or more supply voltages, and programmed to output a stabilization current such that supply currents at each one of the one or more supply voltages remains stable. Accordingly, such a driver may enable a test system to have stable supply currents, stable supply voltages, and in turn, stable and predictable output voltages to more reliably or more precisely test a semiconductor device under test.

According to some embodiments, a voltage driver with supply current stabilization is provided. The voltage driver comprises an output port having an output voltage and an output current; a voltage driver circuit connected to a first supply voltage, a second supply voltage, and the output port; a stabilization port having a stabilization current; a correction driver connected to the first supply voltage, the second supply voltage, and the stabilization port. The correction driver is configured to adjust the stabilization current such that a change in the output current as a result of an output voltage change is offset by a change in the stabilization current.

According to some embodiments, a method for operating a voltage driver is provided. The voltage driver has a first supply port connected to a first supply voltage, a second supply port connected to a second supply voltage, an output port, a stabilization port, and a correction driver connected to the first supply port, the second supply port and the stabilization port. The method comprises receiving a first signal representing a first output voltage; in response to receiving the first signal, generating the first output voltage at the output port and a first stabilization current at the stabilization port, such that the first supply port has a first supply current; receiving a second signal representing a second output voltage that is different from the first output voltage; and in response to receiving the second signal, generating the second output voltage at the output port and a second stabilization current at the stabilization port, such that the first supply port has a second supply current that differs from the first supply current by no more than 10%.

The foregoing is a non-limiting summary of the invention, which is defined by the appended claims.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

DETAILED DESCRIPTION

Figure 1:
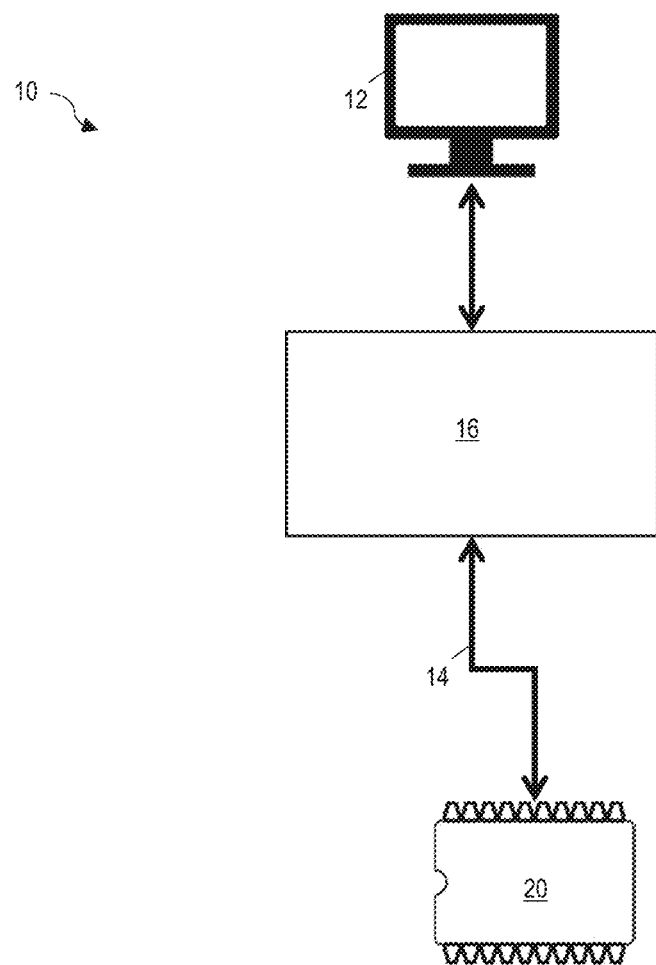
FIG. 1 is a schematic diagram of an exemplary embodiment of an automated test system in which a voltage driver circuit according to aspects of the present application may be applied.

The inventors have recognized and appreciated that testing of modern semiconductor chips, such as large memories, can be improved with new designs for voltage drivers that limit fluctuations in supply voltages. Such techniques may be applied in voltage drivers that are particularly sensitive to voltage supply fluctuations, such as single-ended drivers and voltage drivers based on resistive division between one or more supply voltage levels. As a result, these drivers may be used in PE of an ATE, enabling use of drivers that consume relatively low power. Use of such drivers may also enable PE with a high density of drivers needed to generate a suitably large number of test signals.

The inventors have recognized and appreciated that one way to ensure that the supply voltage levels are stable is to ensure that the voltage driver draws a stable amount of current from each supply voltage over time. In a resistive divider-based voltage driver, output current to a given load will change when output voltage is adjusted, which in turn changes a supply current draw from the voltage supply. The change in supply current can change the supply voltage level, creating an inaccuracy in the output of the voltage drive. The inventors have recognized and appreciated that this inaccuracy may be avoided by a correction driver used to generate a stabilization current to offset the change in output current, such that the change in supply current is substantially reduced or eliminated.

The inventors have recognized and appreciated that the correction driver may be connected to one or more supply voltages and programmed to output a stabilization current such that supply currents at each one of the one or more supply voltages remains stable. The correction driver, for example, may be connected between the voltage supplies and the voltage drivers of the PE. Accordingly, such a driver may enable a test system to have stable supply currents, stable supply voltages, and in turn, stable and predictable output voltages to more reliably or more precisely test a semiconductor device under test. Reliable testing may be achieved even in an ATE in which multiple voltage drivers are used to simultaneously generate a large number of test signals, which might otherwise result in relatively large fluctuations in supply voltage levels.

In accordance with some embodiments, a correction driver may be implemented with a plurality of correction circuit slices. Programmable control over the correction driver may be achieved by setting switches within each of the circuit slices that change the characteristics of the current draw of that circuit slice. The outputs of the slices may be connected together to a stabilization port, so as to collectively provide a stabilization current that may offset a change in output current at an output port of the voltage driver. The switches may be configured to connect components of the circuit slice to one of a plurality of voltage supplies. The number of components within each slice connected to each of the plurality of voltage supplies as well as the number of such components connected to none of the voltage supplies may impact multiple characteristics such as current draw from each of the voltage supplies by the circuit slice. The current drawn by the circuit slices may combine to ensure the sum of the current draw from the plurality of voltage supplies remain stable, and may further balance each other to ensure that each current draw from each individual voltage supply remains stable when the output voltage of the voltage driver is changed.

FIG. 1 is a schematic diagram of an exemplary embodiment of an automated test system in which a voltage driver circuit according to aspects of the present application may be applied. FIG. 1 illustrates a test system 10 that contains a test computer 12 that controls a tester 16 to perform tests on a device under test (DUT) 20 in accordance to methods disclosed in the present application. In some scenarios, the tester 16 may be an automated test equipment (ATE), constructed using techniques that are known in the art. The DUT 20 may be any suitable device for testing. For example, DUT 20 may be a semiconductor device. ATE 16 may contain circuitry to generate and/or measure a test signal 14 for DUT 20. ATE 16 may include multiple instruments configured to generate or measure different types of analog or digital signals.

According to an aspect of the present application, some instruments within ATE 16 may be implemented in the form of pin electronics (PE) with a PE driver that generates output voltage signals of a designed amplitude and timing to provide to a device under test (DUT). For example, digital test instruments, which generate and/or measure digital signals, may be implemented with such PE circuits. Regardless of the specific type of instrument in which it is used, the PE may be implemented as integrated circuits (ICs) that comprise a large number of transistors, such as complementary metal-oxide semiconductor (CMOS) transistors.

It should be appreciated that FIG. 1 is a greatly simplified representation of an automated test system. For example, though not illustrated, test system 10 may include control circuitry that controls operation of instruments within ATE 16. Additionally, test system 10 may include processing circuitry to process measurements and determine whether a DUT 20 is operating correctly. Also, FIG. 1 illustrates a single signal path between ATE 16 and DUT 20. One of skill in the art will appreciate that testing a modern DUT may require hundreds or thousands of test signals to be generated and measured. Accordingly, circuitry as described herein may be duplicated many times within ATE 16 and controlled to provide synchronized test signals for testing DUT 20. Further, though FIG. 1 illustrates a scenario in which a single DUT 20 is being tested, test system 10 may be configured to test multiple devices.

Regardless of the number of instruments or other components generating or measuring test signals and the number of devices under test, test system 10 may include signal delivery components that route the signals between the DUT 20 and the instruments within ATE 16.

Further, it should be appreciated that other components as illustrated are exemplary rather than limiting. For example, although the test computer 12 is illustrated as a personal computer (PC) in FIG. 1, it should be appreciated that any suitable computing device may be used to implement a test computer, for example, a mobile device or a computer work station. Test computer 12 may be connected to a network and capable of accessing resources over the network and/or communicate with one or more other computers connected to the network.

Figure 2:
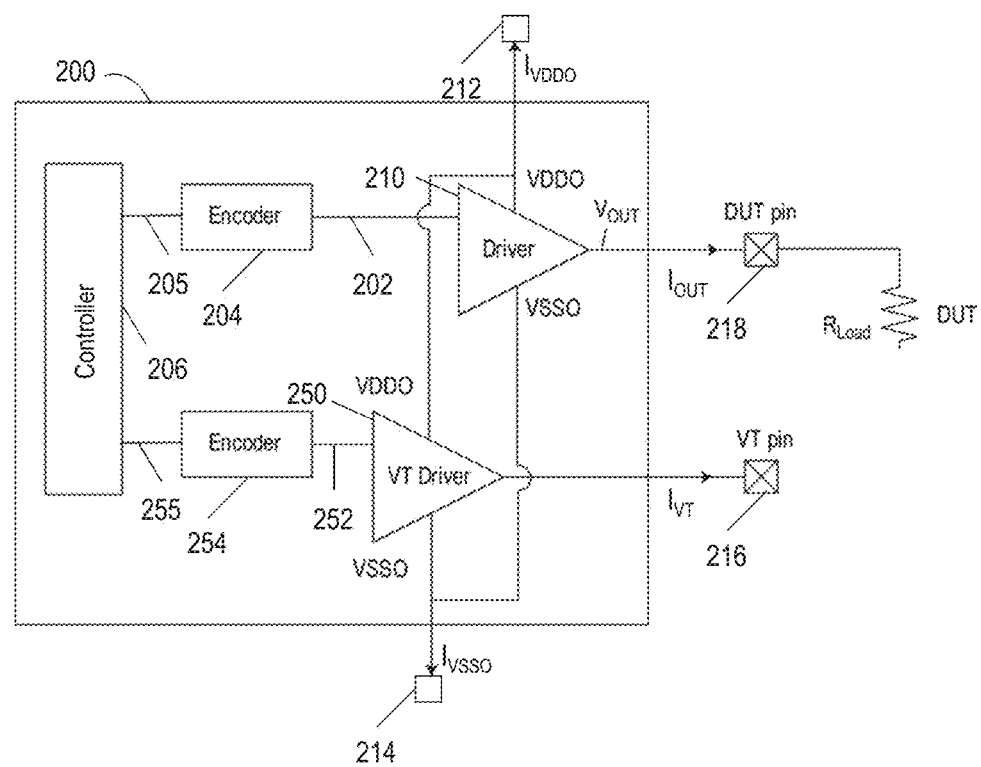
FIG. 2 is a schematic diagram showing an exemplary pin electronics (PE), according to an aspect of the present application.

FIG. 2 is a schematic diagram showing an exemplary PE 200, according to an aspect of the present application. PE 200 includes a voltage driver circuit 210 coupled to a first supply port 212 having a first supply voltage VDDO and a second supply port 214 having a second supply voltage VSSO, and provides an output voltage $V_{OUT}$ at output port 218 in response to driver control signal 202 received from encoder 204. Encoder 204 may generate driver control signal 202 based on input data 205 received from controller 206. It should be appreciated that driver control signal 202 may be an aggregate of a plurality of control signals that set configurations of multiple components within the voltage driver circuit 210 to control the output voltage at $V_{OUT}$. While a single signal path is illustrated in FIG. 2 for driver control signal 202, it should be appreciated that embodiments of the present invention are not so limited and in some embodiments, separate control signals within driver control signal 202 may be applied to multiple control terminals of components within the voltage driver circuit 210. For example, encoder 204 may supply a control signal to each control terminals of a plurality of switches and programmable capacitors within voltage driver circuit 210. In the embodiment shown, voltage driver circuit 210 is a single-ended voltage driver circuit. One or more of the control signals may operate at high speed, such as to enable fast switching between the two voltage levels, while the rest of the control signals may operate at low speed to configure the driver before high-speed operation commences, such as to control the voltage levels and/or other driver characteristics.

Still referring to FIG. 2, controller 206 comprises logic, processors and/or memory elements, and may be disposed either within or external to the PE 200. Input data 205 from controller 206 may be a high speed data having data rates on the order of multiple Gbps, such as up to 10 Gbps. Input data 205 from controller 206 may be high speed data having data rates on the order of multiple Gbps, such as up to 10 Gbps. Input signal 205 may be a high speed data stream having a data rate of 5 Gbps, 20 Gbps, between 1 and 100 Gbps, or between 5 and 50 Gbps, although it should be appreciated that various aspects of the technology disclosed herein may be used with a data stream having any bandwidth. In some embodiments, input data 205 comprises a data stream of values of desired output voltage level versus time. Input data 205 may also comprise configuration data indicative of a target output impedance and time domain peaking behavior. Encoder 204 may generate driver control signal 202 based on the received input data 205 to control the voltage driver circuit 210 to generate an output voltage at $V_{OUT}$ with a waveform that substantially corresponds to the values indicated in input data 205. In some embodiments, a DUT may be connected to $V_{OUT}$ via output port 218 on the exterior of the PE.

According to an aspect of the application, the inventors have recognized and appreciated that when a PE is used to test the DUT at high data rates, output voltage $V_{OUT}$ is programmed to change value in accordance with input data 205. When $V_{OUT}$ changes, output current $I_{OUT}$ of the voltage driver circuit 210 changes, and supply currents drawn by voltage driver circuit 210 will in turn change. Changes in the supply currents in turn can change the operation of the voltage driver circuit. Such changes may be illustrated by the model of the circuit shown in FIG. 3.

Figure 3:
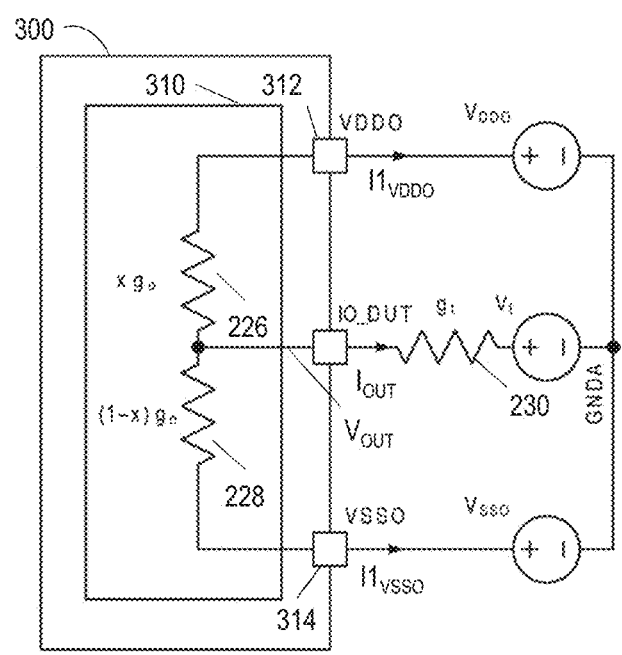
FIG. 3 is a schematic diagram showing an equivalent circuit model for an exemplary PE having a voltage driver circuit, according to an aspect of the present application.

FIG. 3 is a schematic diagram showing an equivalent circuit model for an exemplary PE 300 having a voltage driver circuit 310, according to an aspect of the present application. Voltage driver circuit 310 may represent, for example, voltage driver circuit 210. Voltage driver circuit 310 includes resistors 226, 228 coupled to first supply port VDDO and second supply port VSSO, with output port IO_DUT coupled to a node between resistors 226, 228 in a voltage-divider configuration. The output voltage of voltage driver circuit 310 is based in part on the difference in voltage between the voltage sources coupled to supply ports VDDO and VSSO and the ratio of the resistors 226 and 228. In operation, the voltage output by voltage driver circuit 210 can be set by varying the resistances of the circuit components represented by resistors 226 and 228.

When an output current $I_{OUT}$ flows through IO_DUT output port to a termination conductance $g_t$ at resistor 230 and a terminal voltage $V_t$, the sum of supply currents $I_{IVDDO}$, $I_{IVSSO}$ and $I_{OUT}$ will remain constant, despite changes with output voltage $V_{OUT}$. This means that supply currents $I_{IVDDO}$, $I_{IVSSO}$ will not be stable when $I_{OUT}$ varies due to a change in $V_{OUT}$. In one non-limiting example, if IO_DUT is connected to ground GNDA via a 50Ω load, a change of 1 V in $V_{OUT}$ will lead to changes in pull-up current $II_{VDDO}$ from VDDO of approximately 1 V/50Ω=20 mA, which is not desirable.

A correction driver, as described below, may be used to address some or all of these challenges. Referring back to FIG. 2, a correction driver 250 may be connected to first and second supply ports 212, 214 to generate a stabilization current $I_{VT}$ that can offset changes in $I_{OUT}$, such that supply currents $I_{VDDO}$ and $I_{VSSO}$ at supply ports 212, 214 remain stable. The inventors have recognized and appreciated that based on Kirchoff's current law, the sum of $I_{VT}$, $I_{OUT}$, $I_{VDDO}$ and $I_{VSSO}$ is a time-invariant constant. Therefore as long as the sum of $I_{VT}$ and $I_{OUT}$ is kept stable when $I_{OUT}$ changes, the sum of supply currents $I_{VDDO}$ and $I_{VSSO}$ will be stable. The inventors have also appreciated and recognized that keeping the sum of $I_{VDDO}$ and $I_{VSSO}$ constant may not be sufficient to ensure the stability of voltage driver circuit 210. Even though the sum is stable, one supply current may increase while the other decrease by the same amount. In some embodiments, correction driver 250 may additionally draw current in between supply ports 212 and 214, to balance out supply currents $I_{VDDO}$ and $I_{VSSO}$ such that each of the supply currents is stable.

In the embodiment shown in FIG. 2, the stabilization current $I_{VT}$ is dumped into a stabilization port 216. In some embodiments, stabilization port 216 may be kept at a constant voltage VT. According to an aspect, because correction driver 250 is not connected to output port 218, operation of correction driver 250 does not affect the performance of voltage driver circuit 210 at output port 218. For example, parameters within voltage driver circuit 210 may be adjusted to provide a desirable output impedance, output voltage level, as well as a time-domain peaking behavior at output port 218, without being affected by correction driver 250.

In some embodiments, encoder 204 may be programmed to map programmable driver input signals, to the appropriate driver characteristics. In some embodiments, a calibration or computation may be performed for the driver so that it is possible to determine output voltage, impedance and time constant given for a sufficient number of representative combinations of driver control input signals. A calibration may be repeated under varying load conditions such as load resistance and desired output voltage level. As a result of the calibration, for a desired set of driver characteristics, a set of driver control input signals may be selected that delivers those characteristics as closely as possible.

Further in some embodiments, a calibration or computation may be performed for the correction driver so that it is possible to determine stabilization current given for a sufficient number of representative combinations of driver control input signals that represents for example output voltage levels. As controller 206 provides driver control input signals, it may provide corresponding control signals as input data 255 to encoder 254 that provide for the appropriate stabilization current, which may be determined based on the calibration process, that compensates for current instability. Encoder 254 may generate correction control signal 252 based on the received input data 255 to control the correction driver 250 to generate a stabilization current $I_{VT}$ at stabilization port 216. Encoder 254 may further control correction driver 250 to generate internal currents between multiple supply ports to stabilize individual supply currents.

Input data 255 from controller 206 may be high speed data having data rates on the order of multiple Gbps, such as up to 10 Gbps. This data rate may match the rate at which input data 205 is provided to voltage driver circuit 210. In some embodiments, input data 255 may comprise a data stream of values of desired output voltage levels such that it is the same as input data 205. In such an embodiment, encoder 254 may generate correction control signal 252 based on a mapping between the input data 205 to control voltage driver 210 and control signals to cause correction driver 250 to generate a stabilization current $I_{VT}$ at stabilization port 216.

Figure 4:
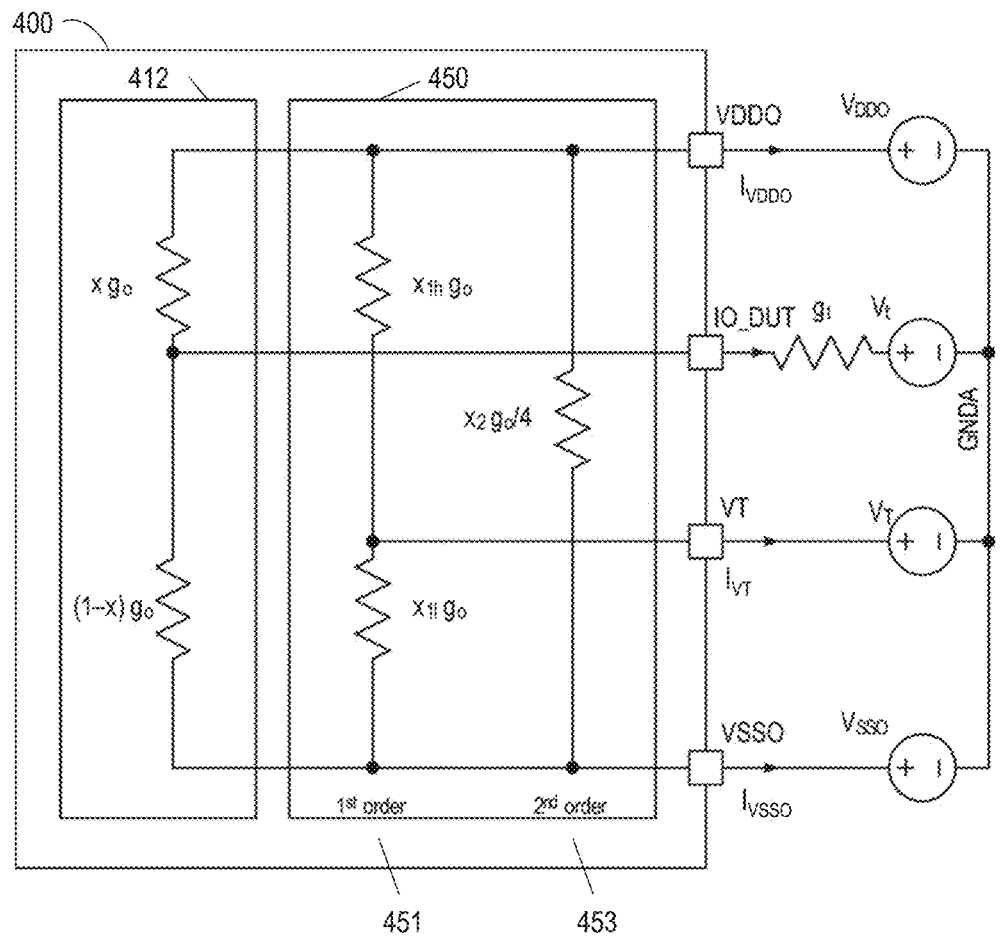
FIG. 4 is a schematic diagram showing an equivalent circuit model for an exemplary PE having a voltage driver circuit and a correction driver, according to an aspect of the present application.

FIG. 4 is a schematic diagram showing an equivalent circuit model for an exemplary PE 400 having a voltage driver circuit 410 and a correction driver 450. Voltage driver circuit 410, like voltage driver circuit 310 includes a resistive divider. The conductance of the resistors in the divider may be varied in operation, such as in response to control signals input to the driver to selectively activating or de-activing circuit slices. Here, the conductances of the components that are modeled by the resistors in the divider are shown as $xg_0$ and $(1-x)g_0$, where x is an amount that is between 0 and 1, which may be set by a control input to the driver.

In FIG. 4, correction driver 450 is represented by two groups of resistive dividers. A first group 451 is coupled between output ports VDDO, VSSO, as well as stabilization port VT, and generates stabilization current $I_{VT}$ based on the resistive legs $x_{1h}g_0$, $x_{1l}g_0$. The values of $x_{1h}$ and $x_{1l}$ are values that reflect changes in the components of correction driver 450 modeled by those resistive legs. A second group 453 is coupled between output ports VDDO, VSSO, but not to either IO_DUT nor VT. The second group 453 may be used to balance current drawn between $I_{VDDO}$ and $I_{VSSO}$ to keep them individually stable.

The voltage driver circuit and correction driver may be implemented with components for which the conductance can be varied under program control. In some embodiments, those components may be implemented as one or more groups of circuit slices which may be operated to provide controllable conductances as illustrated in the models of FIG. 3 and FIG. 4. The circuit slices within a group are connected in parallel between VSSO and VDDO. Each circuit slice also comprises a slice output, with slice outputs of circuit slices within a group coupled to the same node. Within each circuit slice, a resistor switchably connects the slice output through resistors to one or none of supply voltages. In at least one group of circuit slices, the slice outputs are connected to a driver output of the voltage driver circuit. The inventors have recognized and appreciated that a resistor connecting the driver output to one of VSSO or VDDO contributes to an output resistance $R_{OUT}$ by the resistance of the resistor, and therefore by connecting a selected number of circuit slices to the driver output, the output resistance $R_{OUT}$ may be varied based on control inputs to the switches so as to create a parallel combination of resistors in a selected number of circuit slices that provides the desired value of $R_{OUT}$.

According to some embodiments, a first resistor terminal of the resistor within each circuit slice is connected to the slice output. Each circuit slice comprises switches coupled to and controlled by control signals from an encoder to switchably connect a second resistor terminal of the resistor within the circuit slice to one of VDDO and VSSO, or disconnected from both VDDO and VSSO. When a slice output is connected the driver output, the output resistance $R_{OUT}$ is based on a parallel combination of circuit slices that have resistors connected to VDDO or VSSO. These circuit slices may also be referred to as "activated." Circuit slices with the resistor disconnected to either VDDO and VSSO may be referred to as "disconnected" or "deactivated."

According to some embodiments, the circuit slices may be implemented as circuit modules that have the same design and have the same number of circuit elements to simplify circuit design, although it is not a requirement that all circuit slices be implemented identically. In some embodiments, the switches are metal-oxide semiconductor field-effect transistors (MOSFET) such as but not limited to silicon (Si) MOSFET. In one embodiment, the circuit slices comprise Si CMOS and are fabricated using silicon semiconductor manufacturing techniques known in the art. The inventors have appreciated and recognized that implementing part or all of the voltage driver circuit with Si CMOS technology may reduce power consumption. In such an implementation, each circuit slice may be controlled to be in at least one of three states: a high state, with switches connecting the resistor to VDDO; a low state, with switches connecting the resistor to VSSO; and a tri-state, with the first resistor terminal not connected to either VDDO or VSSO, and thus in a floating state.

Aspects of the present application also provide control of output voltage at the driver output. In some embodiments, an output voltage at the slice outputs of a group of circuit slices is adjustable by selectively connecting a first number of circuit slices to VDDO, and selectively connecting a second number of circuit slices to VSSO, or connecting a first ratio of circuit slices to VDDO, and selectively connecting a second ratio of circuit slices to VSSO. In some embodiments, connecting a circuit slice to VDDO or VSSO comprises controlling switches within the circuit slice to connect the first resistor terminal of the resistor to VDDO or VSSO. It should be appreciated that when 100% of the activated circuit slices within a group are connected to VDDO, the open circuit output voltage at the slice outputs will be VDDO. Similarly, when 100% of the activated circuit slices are connected to VSSO, the open circuit output voltage at the slice outputs will be VSSO. Thus when some ratio of the activated circuit slices are connected to VDDO, and the rest of the activated circuit slices are connected to VSSO, the output voltage will be at an intermediate level between VSSO and VDDO.

Because output resistance is adjusted by the number of activated slices, and output voltage is adjusted by the ratio of slices connected to VDDO vs. VSSO within the activated slices, aspects of the present application can provide independent adjustability of output resistance and output voltage.

The number of steps, or number of different values to which the output voltage of the driver can be set, is dependent on the number of circuit slices provided in parallel between the two supply voltages. The step-size, or granularity at which the output voltage of the driver can be changed, depends on the difference between the voltage represented by the smallest step relative to the largest step, divided by the number of steps. Finer control over the output voltage over a relatively large voltage range may be provided with groups of circuit slices, with each group providing output voltages controllable with different step sizes. The output voltages of the groups may be combined to provide the output of the voltage driver.

In some embodiments, the voltage driver circuit may further comprise segmented groups of slices, functioning as a segmented voltage divider ladder. A first group of most-significant bit (MSB) slices, or "coarse slices," have slice outputs directly connected to the driver output, while a second group of less-significant bit (LSB) slices, or "fine slices," have slice outputs connected to the driver output through a string of one or more resistors. More than one LSB segments, and thus more than one groups of LSB or fine slices may be provided to provide additional fine adjustability. The coarse slices and fine slices are connected to the driver output via a network of resistor ladders, such that a change in voltage at slice outputs of the coarse slices contributes to a coarse step that is bigger than a fine step resulting from a similar level of change in voltage at slice outputs of fine slices. The segmented voltage driver circuit as described herein may use any voltage divider resistor ladder network known in the art, such as but not limited to a R-2R ladder, a R-8R ladder. In addition to providing coarse and fine levels of adjustments of output voltage at the driver output, it should be appreciated that such a segmented voltage divider ladder provides similar coarse and fine levels of output resistance adjustability, with a change in output resistance at slice outputs of the coarse slices contributing to a coarse step in $R_{OUT}$, compared to that from the same change in output resistance at slice outputs of the fine slices.

A similar approach may be used to control operation of a correction driver. A correction driver may have one or more groups of correction circuit slices. The correction circuit slices within a group may be connected in parallel between VSSO and VDDO. Within each correction circuit slice, a resistor is switchably connects the slice output to one of supply voltages.

In at least one group of correction circuit slices, a first resistor terminal of the resistor within each circuit slice is connected to the stabilization port. Each correction circuit slice comprises switches coupled to and controlled by control signals from an encoder to switchably connect a second resistor terminal of the resistor within the correction circuit slice to one of VDDO and VSSO, or disconnected from both VDDO and VSSO. When a slice output is connected to the stabilization port, the total stabilization current output $I_{VT}$ is based on a combination of amount of correction circuit slices that have resistors connected to VDDO or VSSO. These circuit slices may also be referred to as "activated." Circuit slices with the resistor disconnected to either VDDO and VSSO may be referred to as "disconnected" or "deactivated."

Figure 5:
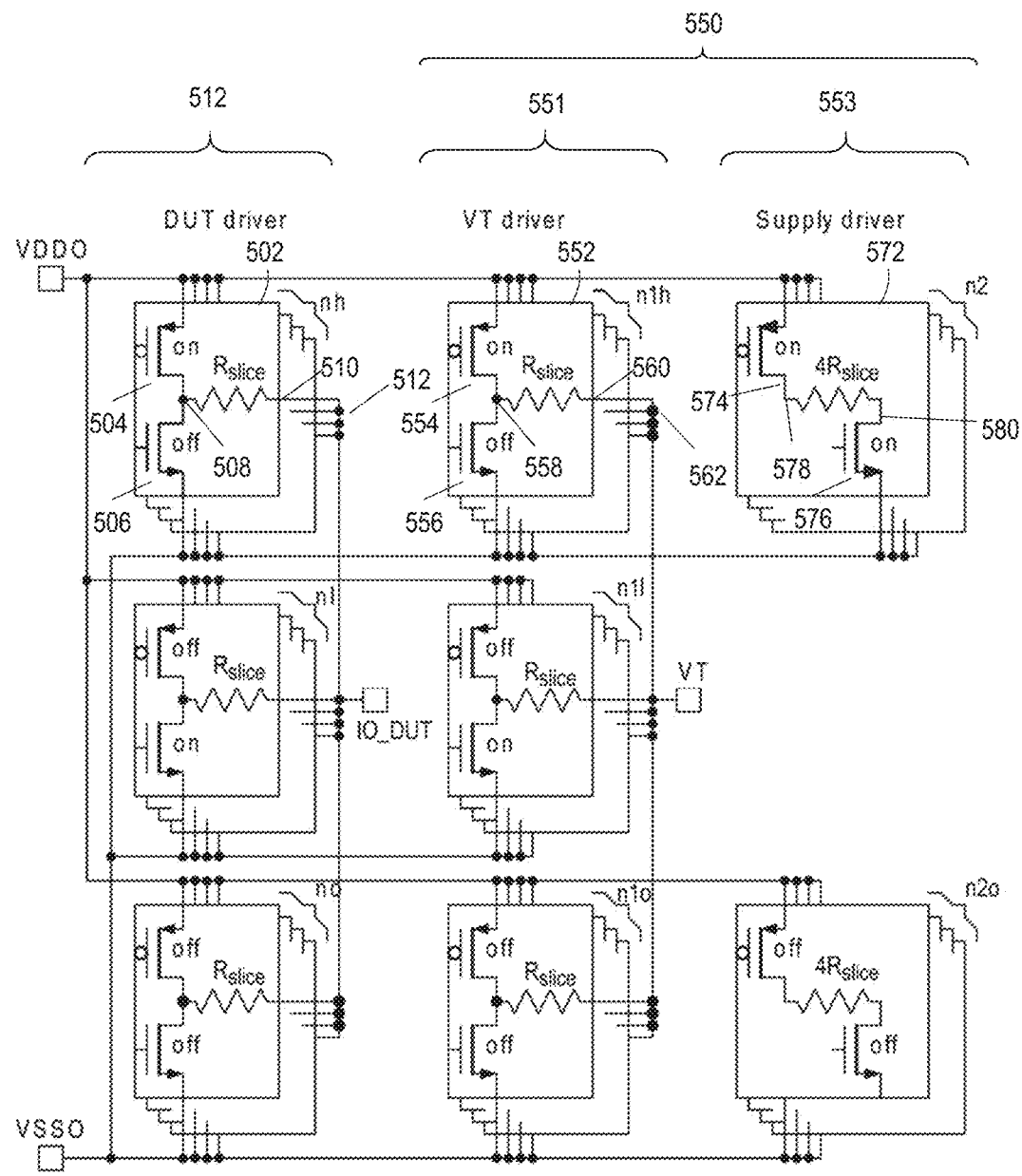
FIG. 5 is a schematic diagram of an exemplary voltage driver circuit and an exemplary correction driver, according to some embodiments.

FIG. 5 is a schematic diagram of an exemplary voltage driver circuit 512 and an exemplary correction driver 550, according to some embodiments.

FIG. 5 shows a voltage driver circuit 512 having a group of circuit slices 502 that are each connected in parallel between supply voltages VDDO and VSSO. While FIG. 5 shows that each circuit slice 502 is substantially identical to each other, it should be appreciated that aspects of the present application are not so limited and that it is not a requirement that circuit slices within one group be identical.

In the embodiment shown in FIG. 5, circuit slice 502 comprises a resistor $R_{slice}$ having a first resistor terminal 510 connected to a slice output 512, a first switch 504 connected between VDDO and a second resister terminal 508 of $R_{slice}$, and a second switch 506 connected between VSSO and the second resister terminal 508. Slice outputs 512 are connected together to output port IO_DUT. Within each circuit slice 502, the slice output 512 is connected to one of the supply voltages through one of switches 504, 506 in series with resistor $R_{slice}$. The inventor has appreciated and recognized that the switch and series $R_{slice}$ arrangement between a supply voltage and the slice output is a low power consumption configuration that provides a large output voltage range at the slice output, at nearly the full rail-to-rail voltage range between VSSO and VDDO when the slice output is connected to an open load. In some embodiments, switches 504 and 506 are implemented with Si CMOS to reduce manufacturing cost and reduce power consumption. It should be appreciated that while $R_{slice}$ is represented by a single resistor symbol in FIG. 5, implementation of $R_{slice}$ is not limited to a single resistor and may comprise, for example, one or more resistors as well as incorporation of static and dynamic resistances in other components on the circuit.

Still referring to FIG. 5, switches 504 and 506 within each circuit slice 502 may be controlled, for example by driver control signal 202 as shown in FIG. 2, to selectively connect $R_{slice}$ to one of the supply voltages VDDO, VSSO, or neither supply voltage. A controller such as controller 206 as shown in FIG. 2 may deactivate no number of circuit slices where both switches 504 and 506 are turned off, nh number of "high" slices connected to VDDO by turning on switches 504 while switches 506 are off, and nl number of "low" slices connected to VSSO by turning on switches 506 while switches 504 are off. The number of activated slices nh+nl may be selected to adjust the output impedance of the group of circuit slices 512 at output port IO_DUT, while an output voltage level at IO_DUT may be adjusted by programming the number nh and nl within activated slices.

While FIG. 5 illustrates that switches 504 and 506 are each implemented by single transistors, it should be appreciated that switches may be implemented in other ways, and is not so limited.

FIG. 5 also shows a correction driver 550 having a first group of correction circuit slices 552, and a second group of correction circuit slices 572 that are each connected in parallel between supply voltages VDDO and VSSO. While FIG. 5 shows that each correction circuit slice 572 and 552 is substantially identical to each other, it should be appreciated that aspects of the present application are not so limited and that it is not a requirement that correction circuit slices within one group be identical. Each correction circuit slice 572 is also similar to circuit slice 502 in the voltage driver circuit 512, and may, in some embodiments, be identical to circuit slice 502 for ease of circuit design, although it is not a requirement that correction circuit slice 572 be the same as circuit slice 502.

In the embodiment shown in FIG. 5, correction circuit slice 552 comprises a resistor $R_{slice}$ having a first resistor terminal 560 connected to a slice output 562, a first switch 554 connected between VDDO and a second resister terminal 558 of $R_{slice}$, and a second switch 556 connected between VSSO and the second resister terminal 558. Slice outputs 562 are connected together to stabilization port VT. Within each correction circuit slice 552, the slice output 562 is connected to one of the supply voltages through one of switches 504, 506 in series with resistor $R_{slice}$. In some embodiments, switches 554 and 556 are implemented with Si CMOS to reduce manufacturing cost and reduce power consumption. It should be appreciated that while $R_{slice}$ is represented by a single resistor symbol in FIG. 5, implementation of $R_{slice}$ is not limited to a single resistor and may comprise, for example, one or more resistors as well as incorporation of static and dynamic resistances in other components on the circuit.

Still referring to the correction driver 550 in FIG. 5, switches 554 and 556 within each correction circuit slice 552 may be controlled, for example by driver control signal 202 as shown in FIG. 2, to selectively connect $R_{slice}$ to one of the supply voltages VDDO, VSSO, or neither supply voltage. A controller such as controller 206 as shown in FIG. 2 may deactivate n1o number of correction circuit slices where both switches 554 and 556 are turned off, n1h number of "high" correction circuit slices connected to VDDO by turning on switches 554 while switches 556 are off, and n1l number of "low" correction circuit slices connected to VSSO by turning on switches 556 while switches 554 are off. The number of respective activated correction slices nh, nl may be selected to adjust the amount of stabilization current draw from VDDO and VSSO at stabilization port VT.

FIG. 5 further shows a second group of correction circuit slices 572, each having a resistor $4R_{slice}$ having a first resistor terminal 578 connected to VDDO via first switch 574, and a second resistor terminal 580 connected to VSSO via second switch 576. In some embodiments, switches 574 and 576 are implemented with Si CMOS to reduce manufacturing cost and reduce power consumption. It should be appreciated that while $4R_{slice}$ is represented by a single resistor symbol in FIG. 5, implementation of $R_{slice}$ is not limited to a single resistor and may comprise, for example, one or more resistors as well as incorporation of static and dynamic resistances in other components on the circuit.

Still referring to the second group of correction circuit slices 572 in FIG. 5, switches 574 and 576 within each correction circuit slice 572 may be controlled, for example by driver control signal 202 as shown in FIG. 2, to selectively connect VDDO to VSSO via $R_{slice}$ to balance current between the two supply ports. A controller such as controller 206 as shown in FIG. 2 may activate n2 number of "closed" correction circuit slices where both switches 574 and 576 are turned on, and deactivate n2o number of "open" correction circuit slices by turning off switches 574 and 576.

An exemplary voltage driver with correction driver, and its operation are now explained with reference to both FIG. 4 and FIG. 5. In this example, let N denote the number of active circuit slices 502 in voltage driver 512. $N_{tot}$ denotes the total number of circuit slices 502 in voltage driver 512. nh and nl denote the number of high and low active circuit slices 502, as described above. It should be appreciated that nh and nl need not to be integers, and may be quasi-continuous numbers, when circuit slices 502 may be "fine" slices in a segmented voltage driver, and when nh and nl denote the number of equivalent "coarse" slices.

The values n1h, n1l, n2 are integer numbers in correction driver 550, which in this example only consists of coarse slices. x is the relative driver level code that may be provided by controller 206, and is between 0 and 1, inclusive. In this embodiment, controller 206 may control the voltage driver's configuration such that nk=N×x, nl=N×(1−x), no=$N_{tot}$−nh−nl (tri-stated).

In this embodiment, controller 206 may control the correction driver's configuration such that $x_{1h}$=[[($g_t/g_{tot}$)×($V_{hl}/N_{hT}$)×($x_{hl}$−x)]], where $x_{hl}$=½($x_h$+$x_l$), $x_h$=½(1+$g_tV_{hl}/(g_oV_{hl})$), $x_l$=½(1+$g_tV_{lt}/(g_oV_{hl})$); $n_{1h}$=[N×$x_{1h}$]; $x_{1l}$=[[($g_t/g_{tot}$)×($V_{hl}/(−V_{lT})$)×(x−$x_{hl}$)]]; $n_{1l}$=[N×$x_{1l}$]; $n_{1o}$=$N_{tot}$−$n_{1h}$−$n_{1l}$. As used herein, the notations [[z]] refers to min(max(z,0),1) or z clipped to the interval [0,1], while the notation [z] refers to z rounded to the nearest integer. Furthermore, $V_{hl}$=VDDO−VSSO, $V_{hT}$=VDDO−VT, $V_{lT}$=VSSO−VT, $V_{ht}$=VDDO−Vt, $V_{lt}$=VSSO−$V_t$, $g_{tot}$=$g_o$+$g_t$, $g_o$ is driver output conductance, $g_t$ is external termination conductance.

Further, for configuration of the second group of correction circuit slices 553, let $x_2$=[[4×($g_o/g_{tot}$)×{(x−$x_1$)$^2$}]] if x≤$x_{hl}$, or $x_2$=[[4×($g_o/g_{tot}$)×{(x−$x_h$)$^2$}]] if x>$x_{hl}$. n2=[N×$x_2$]; n2o=$N_{tot}$−n2, where we again used the notations introduced above.

In the example in FIG. 4, $g_o$ is the voltage driver output conductance (0.02 S in one non-limiting example.) $g_t$=external termination conductance (0 to 0.033 S in some embodiments, 0.02 S in one non-limiting example.) $g_{tot}$=$g_o$+$g_t$. $V_t$=external termination voltage (0 V or about 1.4 V in some embodiments.) $V_T$=supply driver termination voltage=0.56 V in one non-limiting example. $V_{hl}$=VDDO−VSSO=1.68 V−(−0.56) V=2.24 V in one non-limiting example. $V_{ht}$=VDDO−$V_t$, $V_{lt}$=VSSO−$V_t$ (typically <0).

Figure 6:
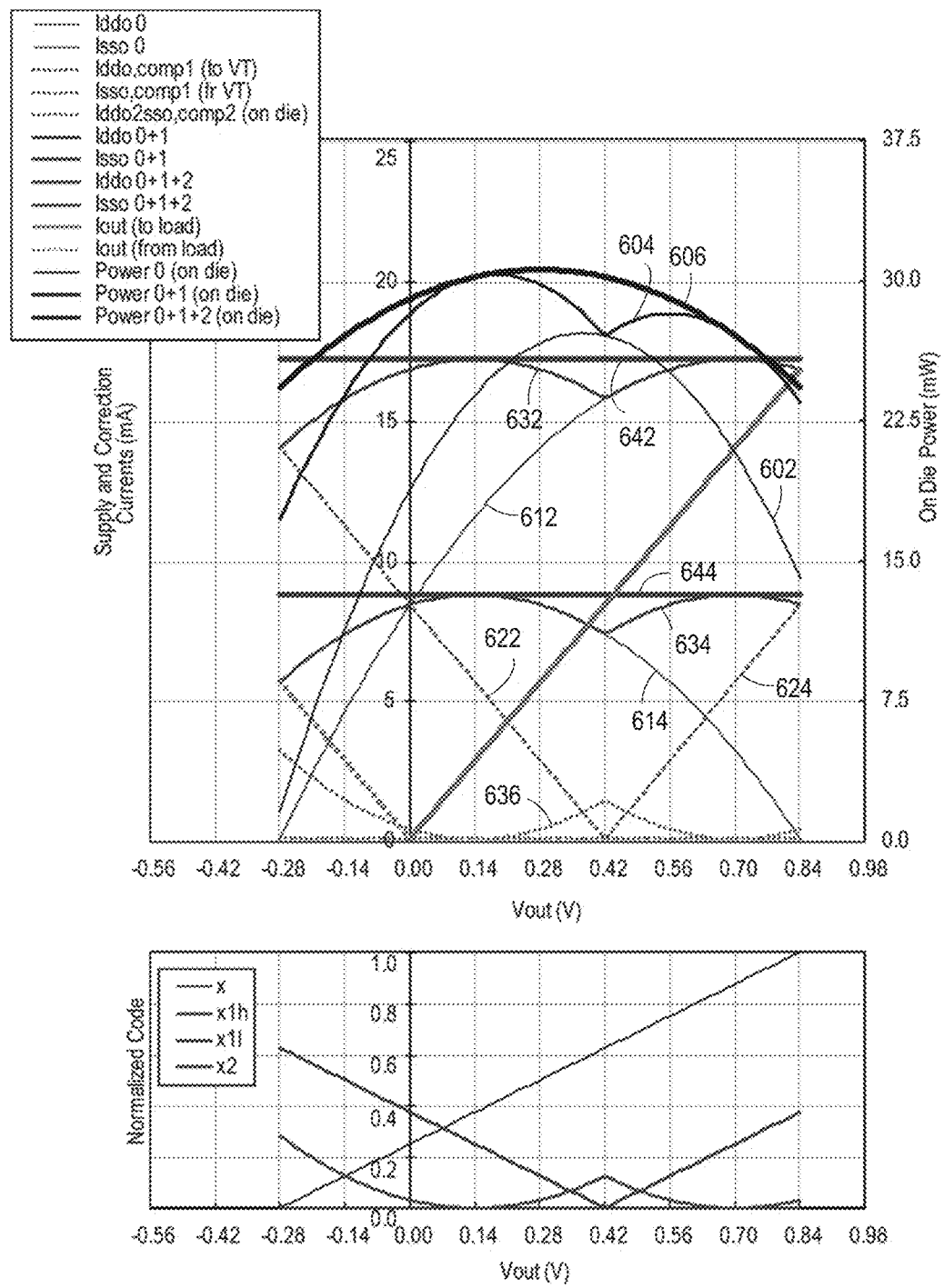
FIG. 6 is a collection of data plots showing supply currents as a function of output voltage in an exemplary voltage driver, according to the embodiment shown in FIGS. 4 and 5.

FIG. 6 is a collection of data plots showing simulated supply currents and power consumption as a function of output voltage in an exemplary voltage driver, according to the embodiment shown in FIGS. 4 and 5. Plot 602 shows power consumption of a voltage driver on a die without a correction driver, while plot 604 and 606 shows power consumption of the voltage driver with only 1st order correction driver, and both 1st and 2nd order correction drivers. Plots 602, 604 and 606 show that given a particular termination voltage $V_t$ and conductance $g_t$, the correction driver adds about 8 mW of power consumption on top of the 30 mW for just the voltage driver circuit, while limiting IDDO and ISSO to constant values.

FIG. 6 provides insight into the equations for the supply driver conductances that may be used to determine control signals to the correction driver. In FIG. 6, Iddo 0 (612) and Isso 0 (614) are the supply currents due to the main driver, i.e. without supply current correction. Iddo,comp1 (622) and Isso,comp1 (624) are piecewise linear current profiles that changes linearly as a function of x (or Vout) that when added to the original supply currents give a considerable improvement; see plots Iddo 0+1 (632) and Isso 0+1 (634). Notice that these latter currents are offset vertically by a fixed amount from each other. This means that the remaining current that needs to be corrected can flow simply from VDDO to VSSO, i.e. it does not need to connect to VT. This can also be seen in FIG. 4. In the plots in FIG. 6, this current is labeled as Iddo2sso,comp2 (636) and it is constructed from two parabolas. Once this correction is applied, i.e. the right number of slices between VDDO and VSSO is turned on as a function of x, we see that the final IDDO and ISSO, namely Iddo 0+1+2 (642) and Isso 0+1+2 (644), are flat. The final power curve, Power 0+1+2 (606), is also much flatter than the power Power 0 (602) without the supply driver corrections.

Still referring to FIG. 6, $I_{DDO}$ of the voltage driver alone, Iddo 0 (612), peaks at 0.70 V, corresponding to x=$x_h$=0.875 relative to a loaded full-scale range of [−0.28, 0.84] V. The reason Iddo 0 peaks before x=1 (or $V_{out}$=0.84 V) is that the current from VDDO through high slices, then low slices into VSSO, i.e. not going to the load, decreases when getting close to either x=0 or x=1, since conductance through either high or low slices becomes zero. This non-load current has a non-linear, parabolic dependence on x. Depending on how much the current from VDDO to the load increases for larger $V_{out}$, this can result in the maximum Iddo 0 not being achieved for x=1.

Referring back to FIG. 5, the coarse slices 502 of the main voltage driver for an IO_DUT output level are grouped by the three states they can be in: high, low, tri-state. The second and third columns contain correction circuit slices related to the supply current stabilization. In the embodiment shown, the correction circuit slices are realized only at the coarse slice level, although it should be appreciated that this is not a requirement. In this embodiment, the coarse slice level implementation in the correction driver means that the current stabilization will not be perfect and leaves up to about 2 (from each correction driver)×(+/−0.5)×(1/54)×20 mA=+/−0.4 mA errors in IDDO and ISSO. In some embodiments, the supply current stabilization in VDDO or VSSO may have no more than 10% variation, when the voltage output at IO_DUT changes by 1 V or more. In some embodiments, the supply current stabilization in VDDO or VSSO may have no more than 5%, or no more than 2% variation, when the voltage output at IO_DUT changes by 1 V or more.

According to an aspect, the first group of correction switches 554, 556 as shown in FIG. 5 may be identical to the voltage driver coarse switches 504, 506 in circuit slices 502. The second group correction switches 574, 576 may use a different switch, for example with higher resistance to reduce static power consumption.

Figure 7:
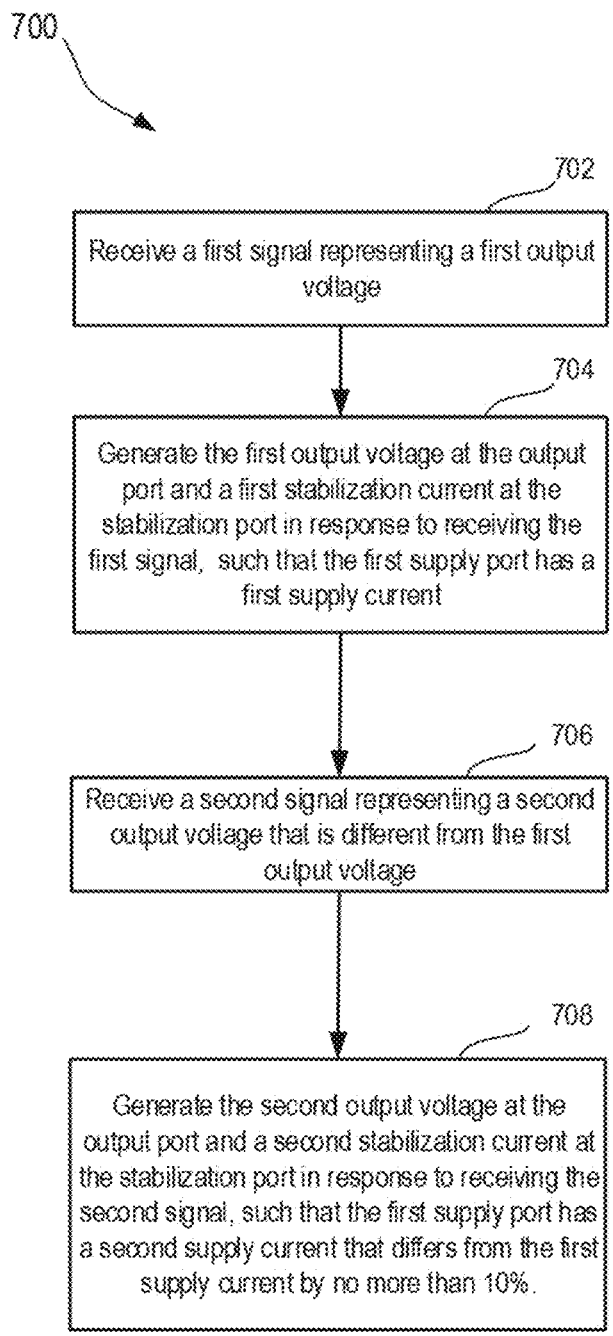
FIG. 7 is a flow chart of a method for operating a voltage driver, according to some embodiments.

FIG. 7 is a flow chart of a method 700 for operating a voltage driver, according to some embodiments. The voltage driver may be a voltage driver with supply current stabilization as described in any of the sections above, and may include a first supply port connected to a first supply voltage, a second supply port connected to a second supply voltage, an output port, a stabilization port, and a correction driver connected to the first supply port.

As shown in FIG. 7, at act 702 of the method 700, a first signal is received that represents a first output voltage. The first signal may be, in some embodiments, input data 205 received from controller 206 as shown in FIG. 2, and may comprise a data stream of desired output voltage waveform having voltage levels and timing sequence. First signal may be a binary data signal, and any suitable encoding schemes may be used to encode voltage waveform information representing a first output voltage within the first signal.

At act 704, the voltage driver generates the first output voltage at the output port and a first stabilization current at the stabilization port in response to receiving the first signal, such that the first supply port has a first supply current. In some embodiments, one or more encoders such as encoders 204 and 254 may be used to receive the first signal from a controller, and generate control input signals to control components within a voltage driver circuit and a correction circuit within the voltage driver to generate the output voltage and the first stabilization current. The encoders may generate control signals by selecting a set of driver control input signals based on the received first signal. In some embodiments, a calibration or computation may be performed for the voltage driver circuit and the correction driver so that it is possible to determine output voltage level and stabilization current given for a sufficient number of representative combinations of driver control input signals that represents for example output voltage levels.

At act 706, a second signal is received representing a second output voltage that is different from the first output voltage. In some embodiments, the second signal may indicate a change in output voltage level, such as a signal transition edge in the output voltage waveform.

At act 708, the voltage driver generates the second output voltage at the output port and a second stabilization current at the stabilization port in response to receiving the second signal, such that the first supply port has a second supply current that differs from the first supply current by no more than 10%. In some embodiments, the encoder may generate control signals to control components within the correction driver based on a preprogrammed mapping of a selection of driver control input signals that is known to generate a stabilization current that can approximately offset, if not completely offset, the supply current draw from one or more of the supply voltage ports given the value of the output voltage level, and given the load conditions such as load resistance.

Having thus described several aspects of at least one embodiment of this invention, it is to be appreciated that various alterations, modifications, and improvements will readily occur to those skilled in the art.

For example, while some embodiments as described herein use two supply voltage rails, it should be appreciated that aspects of the present application is not so limited and may be implemented with more than two voltage rails, with one or more circuit slice connected between the more than two voltage rails. Alternatively or additionally, one of the supply voltage rails may be connected to ground.

As another example, it should be appreciated that while aspects of the application are directed to countering supplying current changes as a result of a change in the output voltage of the voltage driver, such as Vout at IO_DUT as shown in FIG. 3, additional external factors may alternatively or additionally affect stability of the supply currents. These external factors include but are not limited to variations in the resistance produced by the driver at its output port, the external resistor value at the output port, the external termination voltage of said external resistor, and the external voltage that the stabilization port connects to. It should be appreciated that depending on the application and the amount of variation introduced from the external factors, embodiments as described herein may be adapted to take into account of known variations of additional factors. If one or more external factors behave in an unknown and unpredictable manner, additional measures may be adopted alongside with the techniques described herein to stabilize supply currents in the voltage driver, which include but are not limited to mapping the behavior of external factors, or stabilizing the external factors.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A voltage driver with supply current stabilization, comprising:
   an output port having an output voltage and an output current;
   a voltage driver circuit connected to a first supply voltage, a second supply voltage, and the output port;
   a stabilization port having a stabilization current;
   a correction driver connected to the first supply voltage, the second supply voltage, and the stabilization port, wherein the correction driver is configured to adjust the stabilization current such that a change in the output current as a result of an output voltage change is offset by a change in the stabilization current, and wherein:
   the correction driver has a plurality of correction circuit slices, each correction circuit slice comprising:
      one or more switches configured to switchably connect a resistor to the first supply voltage or the second supply voltage, and to switchably disconnect the resistor from the first supply voltage and the second supply voltage.

2. The voltage driver of claim 1, further comprising a first supply port connected to the first supply voltage and having a first supply current, wherein the voltage driver circuit and the correction driver are connected to the first supply voltage through the first supply port, and wherein:
   the correction driver is configured to adjust the stabilization current such that the first supply current remains stable when the output voltage changes value.

3. The voltage driver of claim 2, further comprising a second supply port connected to the second supply voltage and having a second supply current, wherein the voltage driver circuit and the correction driver are connected to the second supply voltage through the second supply port, and wherein:
   the correction driver is configured to adjust the stabilization current such that the second supply current remains stable when the output voltage changes value.

4. The voltage driver of claim 2, wherein for each correction circuit slice in the plurality of correction circuit slices:
   a first resistor terminal of the resistor is connected to the stabilization port, and
   the one or more switches comprises a first switch configured to selectively connect a second resistor terminal of the resistor to the first supply voltage, and a second switch configured to selectively connect the second resistor terminal to the second supply voltage.

5. The voltage driver of claim 4, wherein the one or more switches in each correction circuit slice are configured such that the correction circuit slice is in one of:
   a first state where the second resistor terminal is connected to the first supply voltage and not the second supply voltage,
   a second state where the second resistor terminal is connected to the second supply voltage and not the first supply voltage, and
   a third state where the second resistor terminal is disconnected from both the first and second supply voltage.

6. The voltage driver of claim 5, wherein the first supply current changes proportionally with a change in a first amount of correction circuit slices within the plurality of correction circuit slices that are configured to be in the first state.

7. The voltage driver of claim 6, wherein the first supply current changes linearly with the change in the first amount.

8. The voltage driver of claim 5, wherein the plurality of correction circuit slices are a first group of correction circuit slices, and the correction driver further comprises a second group of one or more correction circuit slices, each correction circuit slice in the second group of correction circuit slices comprising one or more switches configured to switchably connect a resistor to the first supply voltage and the second supply voltage, wherein for each correction circuit slice in the second group of correction circuit slices:
   the one or more switches in each correction circuit slice are configured such that the correction circuit slice is in one of:
   a fourth state where the resistor is connected to both the first supply voltage and the second supply voltage, and
   a fifth state where the resistor is disconnected from both the first supply voltage and the second supply voltage.

9. The voltage driver of claim 8, wherein the first supply current changes non- linearly with a change in a second amount of correction circuit slices in the second group of correction circuit slices that are configured to be in the fourth state.

10. The voltage driver of claim 1, wherein the stabilization port is connected to a constant voltage.

11. The voltage driver of claim 1, further comprising an encoder configured to control switching of the one or more switches in the plurality of correction circuit slices, such that the a change in the output current is offset by a change in the stabilization current.

12. The voltage driver of claim 1, wherein the voltage driver circuit comprises a plurality of driver circuit slices, each driver circuit slice comprising:
   a slice output connected to a first resistor terminal of a resistor;
   one or more switches configured to switchably connect a second resistor terminal of the resistor to the first supply voltage or the second supply voltage, and to switchably disconnect the second resistor terminal from the first supply voltage and the second supply voltage;
   wherein the output port is connected to each slice output of the plurality of circuit slices such that the voltage driver is configured to provide the output voltage between the first and second supply voltages.

13. A method for operating a voltage driver having a first supply port connected to a first supply voltage, a second supply port connected to a second supply voltage, an output port, a stabilization port, and a correction driver connected to the first supply port, the second supply port and the stabilization port, the method comprises:

receiving a first signal representing a first output voltage;

in response to receiving the first signal, generating the first output voltage at the output port and a first stabilization current at the stabilization port, such that the first supply port has a first supply current;

receiving a second signal representing a second output voltage that is different from the first output voltage;

in response to receiving the second signal, generating the second output voltage at the output port and a second stabilization current at the stabilization port, such that the first supply port has a second supply current that differs from the first supply current by no more than 10%.

14. The method of claim 13, wherein the correction driver has a plurality of correction circuit slices, each correction circuit slice comprising one or more switches configured to switchably connect a resistor to the first supply voltage or the second supply voltage, and to switchably disconnect the resistor from the first supply voltage and the second supply voltage, and wherein generating the first stabilization current comprises:

controlling switching of the one or more switches in the plurality of correction circuit slices based on the first signal such that each correction circuit slice is in one of:

a first state where the resistor is connected to the first supply voltage and not the second supply voltage, a second state where the resistor is connected to the second supply voltage and not the first supply voltage, and a third state where the resistor is disconnected from both the first and second supply voltage.

15. The method of claim 14, wherein the voltage driver further comprises a voltage driver circuit having a plurality of driver circuit slices connected to the output port, and wherein generating the first output voltage comprises:

based on the first signal, connecting a first amount of driver circuit slices to the first supply voltage and not the second supply voltage, and connecting a second amount of driver circuit slices to the second supply voltage and not the first supply voltage.

16. The method of claim 15, wherein controlling switching of the one or more switches in the plurality of correction circuit slices in the correction driver comprises:

selecting a third amount of correction circuit slices to be connected to the first supply voltage and not the second supply voltage based on the first amount.

17. The method of claim 13, wherein the second supply current differs from the first supply current by no more than 10%, when the second output voltage differs from the first output voltage by more than 1 V.

18. The method of claim 13, wherein the second supply current differs from the first supply current by no more than 2%, when the second output voltage differs from the first output voltage by more than 1 V.

* * * * *